(12) United States Patent
Wei et al.

(10) Patent No.: US 10,291,834 B2
(45) Date of Patent: May 14, 2019

(54) DUAL-CAMERA MODULE ASSEMBLY AND MOBILE TERMINAL

(71) Applicant: GUANGDONG OPPO MOBILE TELECOMMUNICATIONS CORP., LTD., Dongguan (CN)

(72) Inventors: Yi Wei, Dongguan (CN); Yong Li, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 15/816,394

(22) Filed: Nov. 17, 2017

(65) Prior Publication Data

US 2018/0176435 A1 Jun. 21, 2018

(30) Foreign Application Priority Data

Dec. 20, 2016 (CN) .................... 2016 2 1401972 U

(51) Int. Cl.
| | |
|---|---|
| *H04N 5/225* | (2006.01) |
| *H05K 1/14* | (2006.01) |
| *H05K 1/18* | (2006.01) |
| *H05K 1/02* | (2006.01) |
| *H04M 1/02* | (2006.01) |

(Continued)

(52) U.S. Cl.
CPC ........ *H04N 5/2258* (2013.01); *H04M 1/0264* (2013.01); *H04N 5/2252* (2013.01);
(Continued)

(58) Field of Classification Search
CPC .. H04N 5/2252–5/2254; H04N 5/2257; G02B 3/0075; G02B 5/201; G02B 7/006;
(Continued)

(56) References Cited

U.S. PATENT DOCUMENTS

| | | | | |
|---|---|---|---|---|
| 2010/0259905 | A1 | 10/2010 | Tanno | |
| 2014/0210675 | A1* | 7/2014 | Hwang | ................... H01Q 1/44 343/702 |

(Continued)

FOREIGN PATENT DOCUMENTS

| | | |
|---|---|---|
| CN | 101877731 A | 11/2010 |
| CN | 102762069 A | 10/2012 |

(Continued)

OTHER PUBLICATIONS

European Patent Application No. 17203534.7 extended Search and Opinion dated Mar. 16, 2018, 6 pages.

(Continued)

*Primary Examiner* — Kelly L Jerabek
(74) *Attorney, Agent, or Firm* — Lathrop Gage LLP

(57) ABSTRACT

A dual-camera module assembly includes a first flexible printed circuit (FPC), a second FPC, a first camera module and a second camera module. The first FPC includes a first body and a first connecting end, the first body being connected to the first camera module. The second FPC includes a second body, and an extension portion and a second connecting end sequentially extending from the second body, the second body being connected to the second camera module, the extension portion and the first body are arranged in a superposition manner. The first connecting end and the second connecting end are connected to a main circuit board. A smallest one of distances from the first connecting end to an antenna clearance zone of the main circuit board and distances from the second connecting end to the antenna clearance zone is greater than or equal to a predetermined value.

20 Claims, 6 Drawing Sheets

(52) U.S. Cl.
CPC ........... *H04N 5/2257* (2013.01); *H05K 1/028* (2013.01); *H05K 1/14* (2013.01); *H05K 1/189* (2013.01); *H04M 1/0277* (2013.01); *H05K 2201/10121* (2013.01)

(58) Field of Classification Search
CPC .......... G02B 7/021; G02B 7/02; G02B 7/025; H01L 27/14618; H01L 27/14625; H01L 31/0203; H05K 1/0277; H05K 2201/10121
See application file for complete search history.

(56) References Cited

U.S. PATENT DOCUMENTS

| | | | |
|---|---|---|---|
| 2014/0212127 A1* | 7/2014 | Chen | H04N 5/2257 396/542 |
| 2017/0064172 A1* | 3/2017 | Vittu | H04N 5/2253 |
| 2017/0195537 A1* | 7/2017 | Chang | H04N 5/232 |
| 2017/0264801 A1* | 9/2017 | Wang | G02B 3/0075 |
| 2018/0048799 A1* | 2/2018 | Bachar | G02B 13/003 |

FOREIGN PATENT DOCUMENTS

| | | |
|---|---|---|
| CN | 104333687 A | 2/2015 |
| CN | 204305161 U | 4/2015 |
| CN | 204305162 U | 4/2015 |
| CN | 204305163 U | 4/2015 |
| CN | 104717325 A | 6/2015 |
| CN | 205545547 U | 8/2016 |

OTHER PUBLICATIONS

PCT/CN2017/083956 International Search Report and Written Opinion dated Sep. 12, 2017, 12 pages.

\* cited by examiner

DUAL-CAMERA MODULE ASSEMBLY AND MOBILE TERMINAL

CROSS-REFERENCE TO RELATED APPLICATIONS

The application claims priority to and benefits of Chinese Patent Application Serial No. 201621401972.2, filed with the State Intellectual Property Office of P. R. china on Dec. 20, 2016, the entire content of which is incorporated herein by reference.

FIELD

The present disclosure relates to a technical field of communication equipment, and particularly, to a dual-camera module assembly and a mobile terminal having the dual-camera module assembly.

BACKGROUND

At present, photography technology by using a dual-camera is on the rise in a field of portable terminals, such as mobile phones, tablet PCs and so on. The dual-camera includes two cameras having different focal lengths, adopts two separate modules, and has independent sensors, such that image quality can be improved greatly even in a low-light environment.

The dual-camera module in the related art includes a first camera module 11 and a second camera module 12 installed separately. The first camera module 11 and the second camera module 12 are connected to a printed circuit board (PCB) 15 through a first flexible printed circuit (FPC) 13 and a second FPC 14 correspondingly. The PCB 15 is provided with an antenna clearance zone 16, the antenna clearance zone 16 means no existence of any devices and ground lines around an antenna or in a vertical projection surface of the antenna. The larger an area of the antenna clearance zone is, the less interference there is on the antenna. A distance between the first FPC 13 and the antenna clearance zone 16 is too small, and the first FPC 13 even partially overlaps the antenna clearance zone 16. Since traces in the first FPC 13 generate an interference signal, the antenna in the antenna clearance zone 16 is subject to interference, thereby causing problems, for example, distortion of signal transmission.

SUMMARY

The dual-camera module assembly provided by the present disclosure is applied to a mobile terminal, and includes a first FPC, a second FPC, a first camera module and a second camera module juxtaposed with the first camera module. The first FPC includes a first body and a first connecting end extending from the first body, the first body being connected to the first camera module, and the first connecting end being configured to be connected to a main circuit board of the mobile terminal. The second FPC includes a second body, and an extension portion and a second connecting end sequentially extending from the second body, the second body being connected to the second camera module, the extension portion and the first body being arranged in a superposition manner, and the second connecting end being configured to be connected to the main circuit board of the mobile terminal. The first connecting end and the second connecting end are configured so that a smallest one of distances from the first connecting end to an antenna clearance zone of the main circuit board and distances from the second connecting end to the antenna clearance zone is greater than or equal to a predetermined value.

The present disclosure further provides a dual-camera module assembly, the dual-camera module assembly is applied to a terminal, and includes a first FPC, a second FPC, a first camera module and a second camera module juxtaposed with the first camera module. The first FPC includes a first body and a first connecting end extending from the first body, the first body being connected to the first camera module. The second FPC includes a second body, and an extension portion and a second connecting end sequentially extending from the second body, the second body being connected to the second camera module, and the extension portion being superposed on the first body. The first connecting end and the second connecting end are configured so that a smallest one of distances from the first connecting end to an antenna clearance zone of a main circuit board of the terminal and distances from the second connecting end to the antenna clearance zone is greater than or equal to a predetermined value.

The present disclosure further provides a mobile terminal, the mobile terminal includes the dual-camera module assembly according to any one of the above embodiments and a main circuit board, and the main circuit board is provided with the antenna clearance zone.

BRIEF DESCRIPTION OF THE DRAWINGS

In order to more clearly illustrate embodiments of the present disclosure or technical solutions in the related art, drawings used in description of the embodiments or the related art will be briefly described below. Obviously, the drawings in the following description merely involve some embodiments of the present disclosure, and it will be apparent to those skilled in the art that other drawings can be obtained based on these drawings without creative efforts.

DETAILED DESCRIPTION

Figure 1:
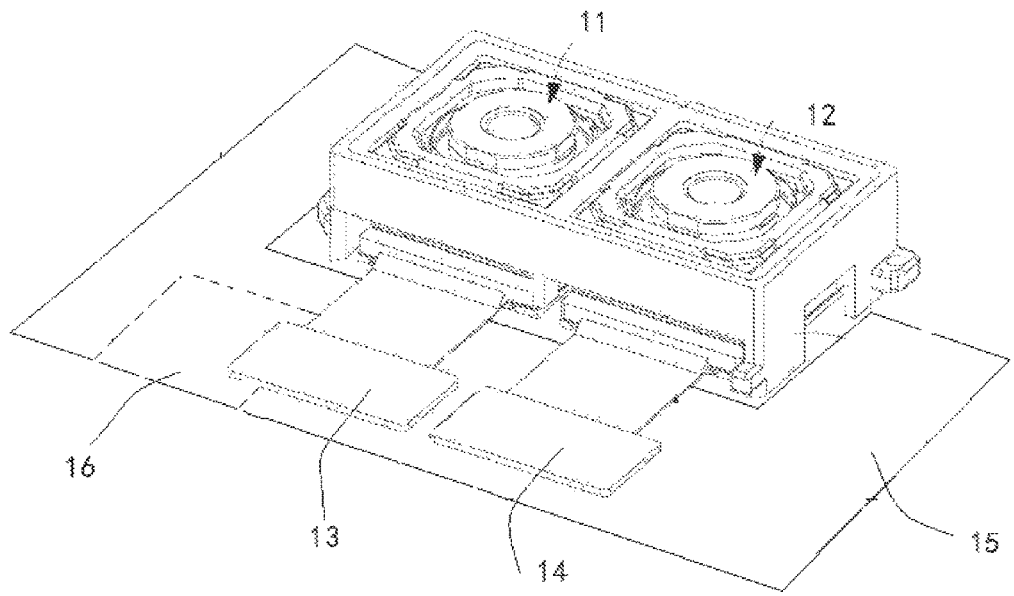
FIG. 1 illustrates a schematic view of a dual-camera module assembly in the related art.

Technical solution in embodiments of the present disclosure will be described clearly and completely with reference to accompanying drawings in the embodiments of the present disclosure. The embodiments described herein are part of the embodiments of the present disclosure rather than all of them. Based on the embodiments of the present disclosure, other embodiments obtained by those skilled in the art on the premise of paying no creative efforts belong to the protection scope of the present disclosure.

In addition, the following description of the embodiments is provided with reference to the accompanying drawings to exemplify particular embodiments that can implement the present disclosure. In the description of the present disclosure, it is to be understood that directional terms such as "upper," "lower," "front," "rear," "left," "right," "inner," "outer" and "lateral" are only explanatory directions with reference to the accompanying drawings. Thus, the directional terms used herein are intended to explain and understand the present disclosure better and more clearly, rather than indicate or imply that the device or element referred to must have a particular orientation, or constructed or operated in a particular orientation. Thus, these terms cannot be constructed to limit the present disclosure.

In the description of the present disclosure, it should be noted that, unless specified or limited otherwise, the terms "mounted," "connected," "coupled" and the like are interpreted broadly, and may be, for example, fixed connections, detachable connections, or integral connections; may also be mechanical connections; may also be direct connections or indirect connections via intervening structures; may also be inner communications or mutual interaction of two elements, which can be understood by those skilled in the art according to specific situations.

Furthermore, in the description of the present disclosure, the term "a plurality of" means two or more than two, unless specified otherwise. If a term "process" appears in the specification, the term refers not only to an independent process, but also to other processes that cannot be clearly distinguished, as long as the desired effect of the "process" can be achieved. Moreover, the numerical range indicated by "~" in the present specification refers to a range in which the values in front of and in behind of the symbol "~" are included as the minimum and maximum values, respectively. In the accompanying drawings, the same or similar structures are denoted by same reference numerals.

For a mobile terminal, an antenna is provided in an internal PCB, and no electronic elements and components are provided in an area around the antenna. This area can be called an antenna clearance zone that can be substantially rectangular. Generally, the antenna clearance zone is about 1.6 times as long as the antenna, and about 1.6 times as wide as the antenna. A distance between the electronic elements and components (e.g. a FPC) in the mobile terminal and the antenna clearance zone should be as great as possible.

Figure 2:
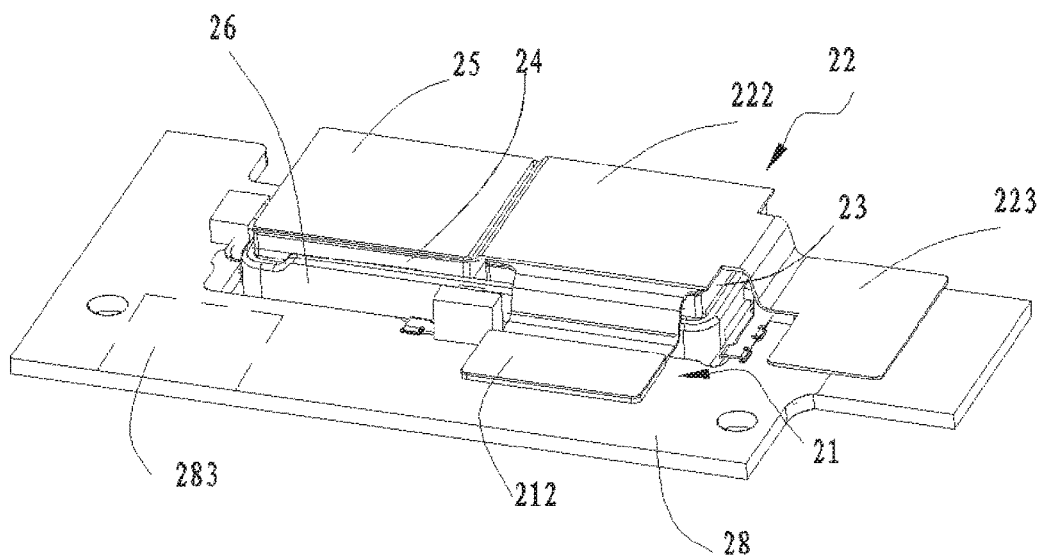
FIG. 2 illustrates a schematic view of a dual-camera module assembly according to a first embodiment of the present disclosure.
Figure 3:
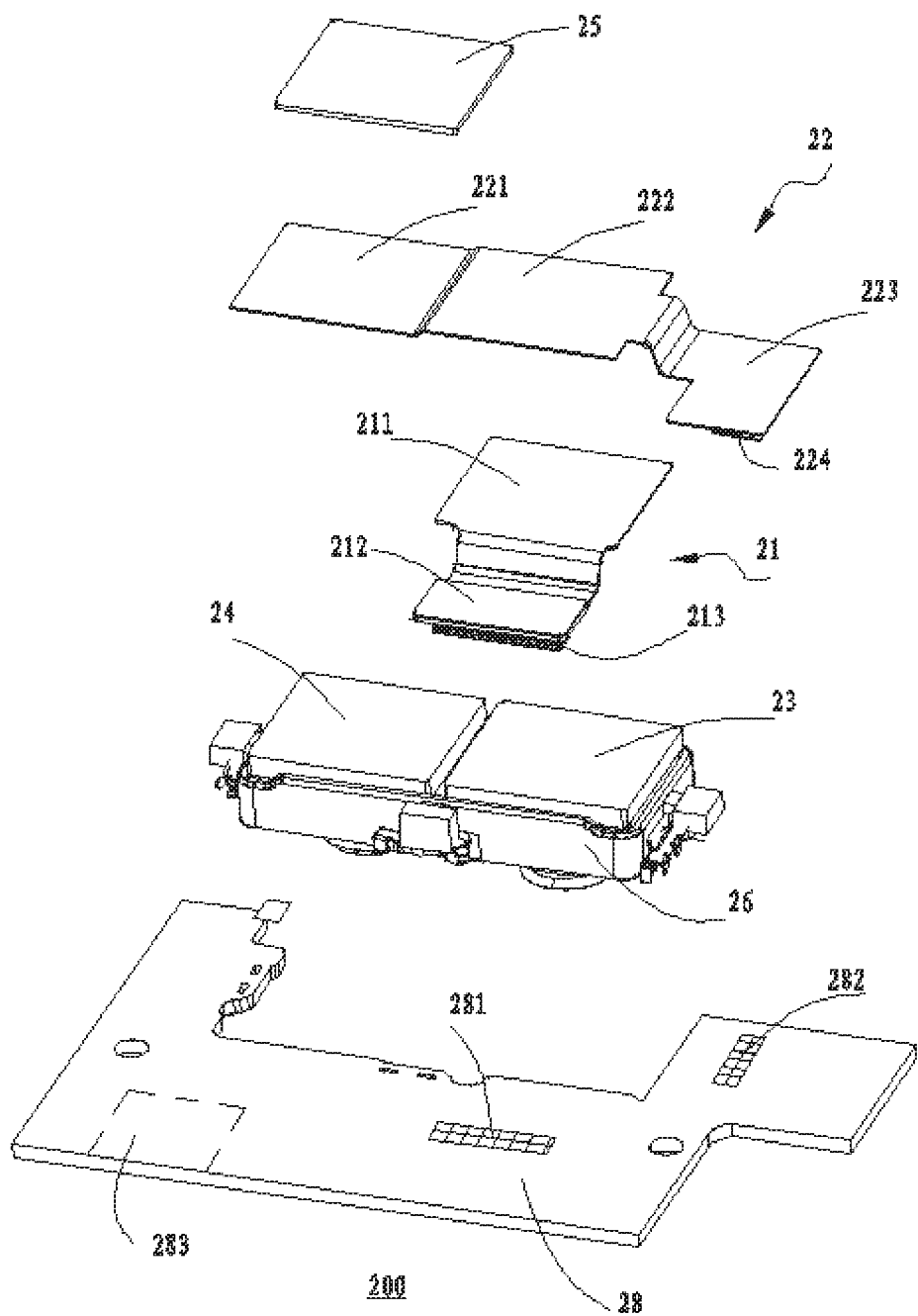
FIG. 3 illustrates an exploded view of the dual-camera module assembly of FIG. 2.

FIG. 2 illustrates a schematic view of a dual-camera module assembly according to a first embodiment of the present disclosure, and FIG. 3 illustrates an exploded view of the dual-camera module assembly of FIG. 2. In the first embodiment of the present disclosure, a dual-camera module assembly 200 includes a first FPC 21, a second FPC 22, and a first camera module 23 and a second camera module 24 juxtaposed with the first camera module. The first FPC 21 includes a first body 211 and a first connecting end 212 extending from the first body 211. In some embodiments of the present disclosure, the first connecting end 212 extends from the first body 211 along a second direction. The second direction in the present disclosure refers to a direction perpendicular to an arrangement direction of the first camera module 23 and the second camera module 24. The first body 211 is electrically connected to a bottom of the first camera module 23, and the first connecting end 212 is connected to a main circuit board 28 of the mobile terminal.

The second FPC 22 includes a second body 221, and an extension portion 222 and a second connecting end 223 sequentially extending from the second body 221. In some embodiments of the present disclosure, the extension portion 222 and the second connecting end 223 extend from the second body 221 sequentially along a first direction. The first direction in the present disclosure refers to a direction parallel to the arrangement direction of the first camera module 23 and the second camera module 24. The second body 221 is electrically connected to a bottom of the second camera module 24. The extension portion 222 and the first body 211 are arranged in the superposition manner. In other words, the extension portion 222 covers the first body 211. The second connecting end 223 is connected to the main circuit board 28 of the mobile terminal.

The main circuit board 28 is provided with an antenna clearance zone 283. In some embodiments of the present disclosure, the second camera module is arranged more adjacent to the antenna clearance zone 283 compared with the first camera module 23. Distances from the first connecting end 212 and distances from the second connecting end 223 to the antenna clearance zone 283 of the main circuit board 28 are greater than or equal to a predetermined value. Specifically, the predetermined value in the present disclosure refers to a minimum distance from the first connecting end 212 to the antenna clearance zone 283 of the main circuit board 28 in this embodiment.

In this embodiment, the first connecting end 212 extends from the first body 211 of the first FPC 21 along the second direction; the extension portion 222 and the second connecting end 223 extend from the second body 221 of the second FPC 22 along the first direction, and the extension portion 222 and the first body 211 are arranged in the superposition manner, such that the second connecting end 223 avoids the antenna clearance zone 283. A smallest one of the distances from the first connecting end 212 to the antenna clearance zone 283 of the main circuit board 28 and the distances from the second connecting end 223 to the antenna clearance zone 283 is greater than or equal to the predetermined value, thereby reducing interference of the dual-camera module assembly 200 on an antenna.

In an embodiment of the present disclosure, the first connecting end 212 is provided with a first connector 213, and the second connecting end 223 is provided with a second connector 224. Correspondingly, the main circuit board 28 of the mobile terminal is provided with a first slot 281 and a second slot 282. The first connector 213 is configured to be connected to the first slot 281 in the main circuit board 28 of the mobile terminal; the second connector 224 is configured to be connected to the second slot 282 in the main circuit board 28 of the mobile terminal. Further specifically, the first connector 213 and the second connector 224 are configured as board to board (BTB) connectors.

In an embodiment of the present disclosure, the dual-camera module assembly 200 further includes a reinforcement board 25. The reinforcement board 25 is provided to a side of the second body 221 away from the second camera module 24, that is, the reinforcement board 25 covers a surface of the second body 221. In other words, the second body 221 is located between the reinforcement board 25 and the second camera module 24. Since the second FPC 22 is larger in dimension than the first FPC 21, the second FPC 22 is subject to greater stress during installation. The reinforcement board 25 provided on the second body 221 can enhance structural strength of the second FPC 22.

In an embodiment of the present disclosure, the dual-camera module assembly 200 further includes a mounting rack 26. The first camera module 23 and the second camera module 24 are mounted to the mounting rack 26, and the mounting rack 26 is fixedly connected to the main circuit board 28 of the mobile terminal. By providing the mounting rack 26, the first camera module 23 and the second camera module 24 can be fixedly connected to the main circuit board 28 of the mobile terminal in terms of the structure, to enhance connection stability between the first camera module 23 and the second camera module 24 and the main circuit board 28. Further specifically, the mounting rack 26 is made of a metal material. In other embodiments of the present disclosure, the mounting rack 26 can employ other materials with high structural strength.

Figure 4:
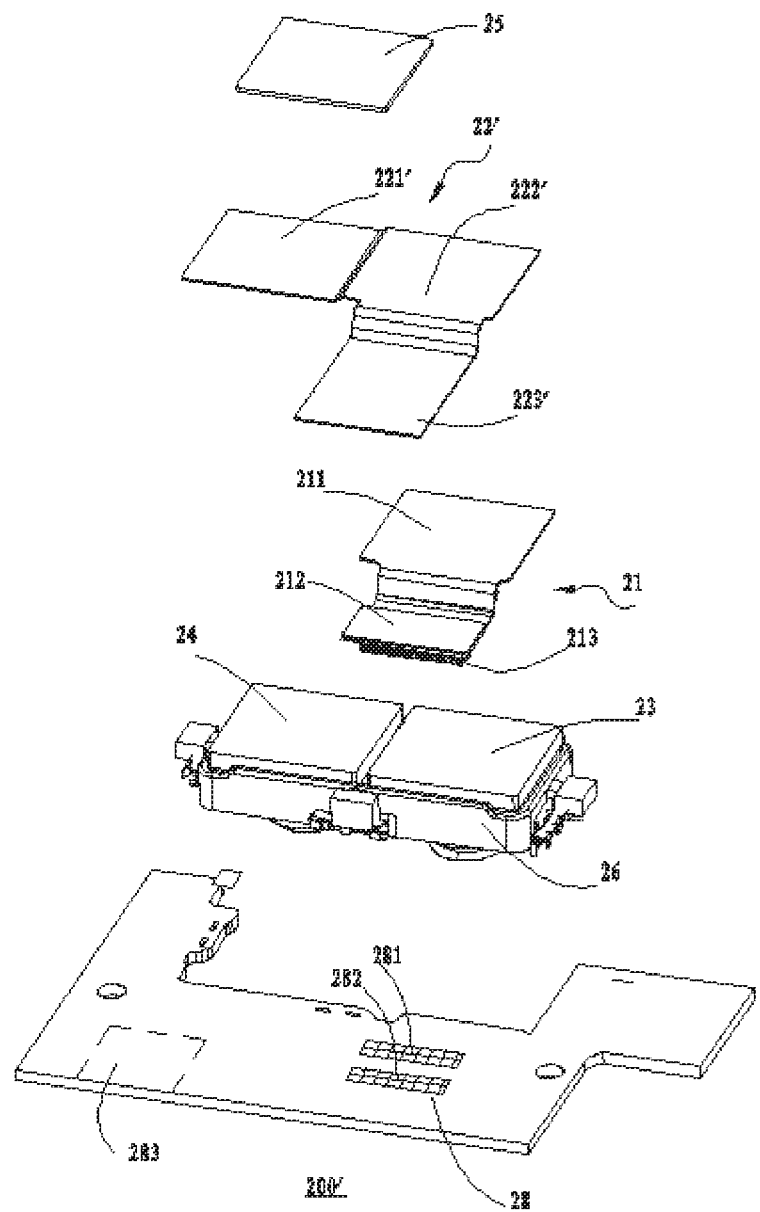
FIG. 4 illustrates an exploded view of a dual-camera module assembly according to a second embodiment of the present disclosure.

Referring to FIG. 4, FIG. 4 illustrates an exploded view of a dual-camera module assembly 200' according to a second embodiment of the present disclosure. The second embodiment of the present disclosure differs from the first embodiment in that a second connecting end 223' extends from an extension portion 222' of a second FPC 22' along the second direction, i.e. the second FPC 22' is substantially L-shaped. The extension portion 222' and the first connecting end 212 are arranged in a paralleled and staggered manner.

In this embodiment, the first connecting end extends from the first body of the first FPC along the second direction; the second connecting end extends from the extension portion along the second direction. The smallest one of the distances from the first connecting end to the antenna clearance zone of the main circuit board and the distances from the second connecting end to the antenna clearance zone is equal to the predetermined value, thereby reducing the interference of the dual-camera module assembly on the antenna.

Figure 5:
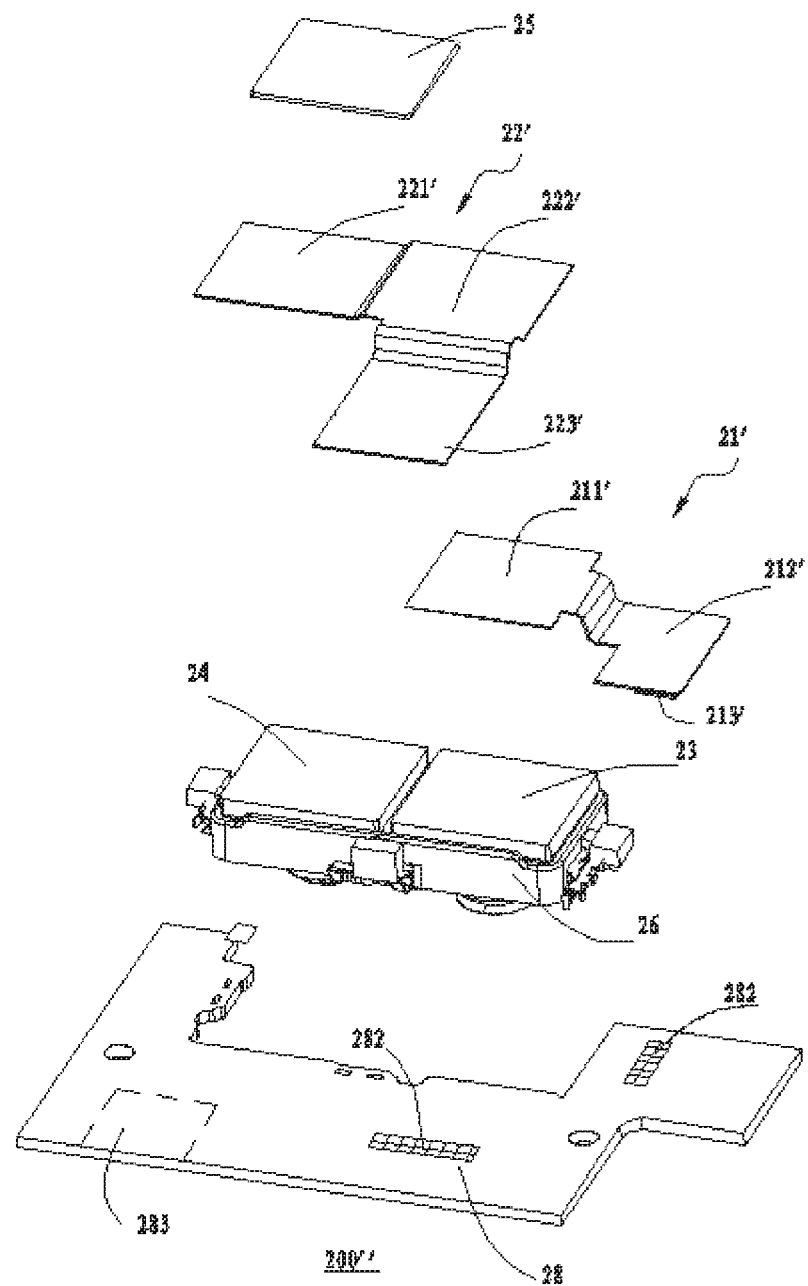
FIG. 5 illustrates an exploded view of a dual-camera module assembly according to a third embodiment of the present disclosure.

Referring to FIG. 5, FIG. 5 illustrates an exploded view of a dual-camera module assembly 200'' according to a third embodiment of the present disclosure. The third embodiment of the present disclosure differs from the first embodiment in that a first connecting end 212' extends from a first body 211' of a first FPC 21' along the first direction. The second connecting end 223' extends from the extension portion 222' along the second direction. That is, the second FPC 22' is substantially L-shaped.

In this embodiment, the first connecting end extends from the first body of the first FPC along the first direction; the second connecting end extends from the extension portion along the second direction, and the extension portion and the first body are arranged in the superposition manner, such that the second connecting end avoids the antenna clearance zone. The smallest one of the distances from the first connecting end to the antenna clearance zone of the main circuit board and the distances from the second connecting end to the antenna clearance zone is larger than or equal to the predetermined value, thereby reducing the interference of the dual-camera module assembly on the antenna.

Figure 6:
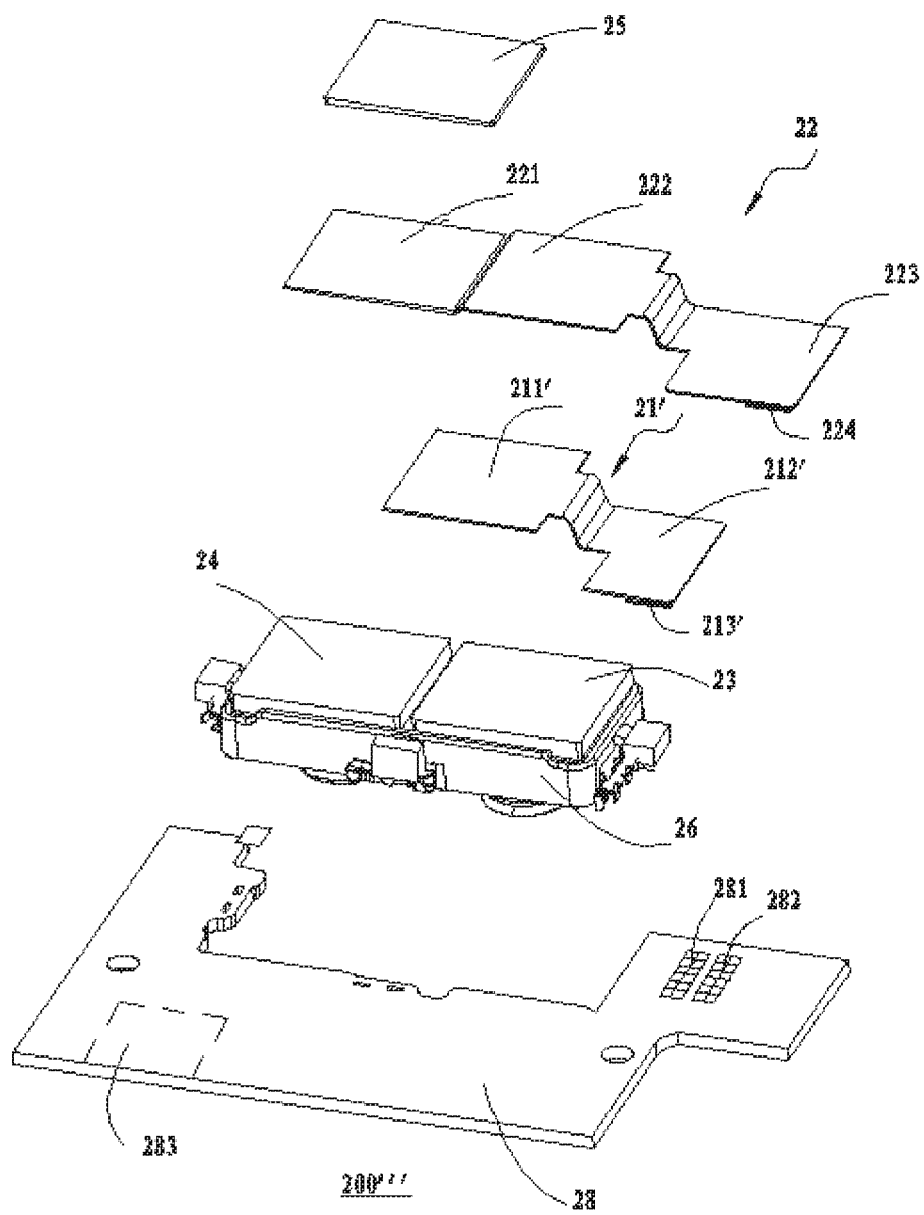
FIG. 6 illustrates an exploded view of a dual-camera module assembly according to a fourth embodiment of the present disclosure.

Referring to FIG. 6, FIG. 6 illustrates an exploded view of a dual-camera module assembly according to a fourth embodiment of the present disclosure. The fourth embodiment of the present disclosure differs from the first embodiment in that the first connecting end 212' extends from the first body 211' along the first direction. The extension portion 222 of the second FPC 22 and the first connecting end 212' are arranged in the paralleled and staggered manner.

In this embodiment, the first connecting end extends from the first body of the first FPC along the first direction; the extension portion and the second connecting end extend sequentially from the second FPC along the first direction. The smallest one of the distances from the first connecting end to the antenna clearance zone of the main circuit board and the distances from the second connecting end to the antenna clearance zone is greater than the predetermined value, thereby reducing the interference of the dual-camera module assembly on the antenna.

Figure 7:
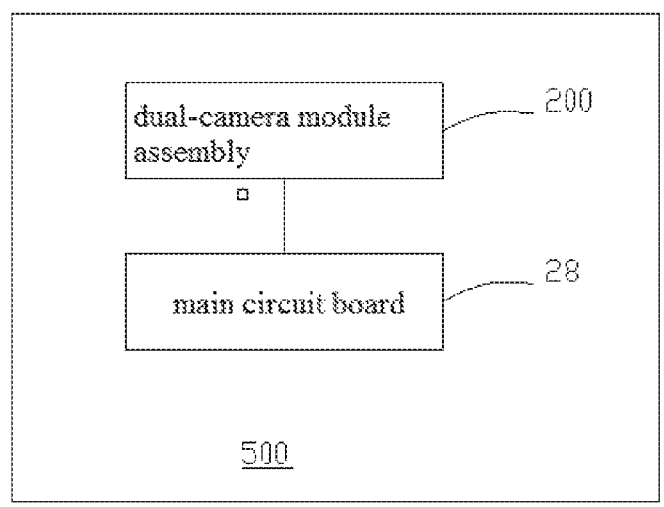
FIG. 7 is a block diagram of a structure of a mobile terminal according to the present disclosure.

The present disclosure further provides a mobile terminal. Referring to FIG. 7, FIG. 7 is a block diagram of a structure of a mobile terminal according to an embodiment of the present disclosure. A mobile terminal 500 includes a dual-camera module assembly 200 and a main circuit board 28. It could be understood that the dual-camera module assembly 200 is the dual-camera module assembly according to any one of the above embodiments, and the main circuit board 28 is the main circuit board according to any one of the above embodiments. The main circuit board 28 is provided with the antenna clearance zone. In some embodiments of the present disclosure, the second camera module is arranged more adjacent to the antenna clearance zone compared with the first camera module. The dual-camera module assembly 200 is electrically connected with the main circuit board 28. Further specifically, the main circuit board can be a PCB or FPC.

It could be understood that the mobile terminal according to the present disclosure can be a mobile phone, a tablet computer, a television, a monitor, a laptop, a digital photo frame, a navigator, etc.

Reference throughout this specification to "an embodiment," "some embodiments," "an example," "a specific example" or "some examples" means that a particular feature, structure, material, or characteristic described in connection with the embodiment or example is included in at least one embodiment or example of the present disclosure. Thus, the appearances of the above phrases throughout this specification are not necessarily referring to the same embodiment or example of the present disclosure. Furthermore, the particular features, structures, materials, or characteristics may be combined in any suitable manner in one or more embodiments or examples.

The above embodiments cannot be construed as limiting the protection scope of the present disclosure. Modifications, equivalent alternatives and improvements can be made in the embodiments without departing from the spirits and principles of the present disclosure, and can fall into the protection scope of the present disclosure.

What is claimed is:

1. A dual-camera module assembly, applied in a mobile terminal and characterized in that the dual-camera module assembly comprises a first flexible printed circuit, a second flexible printed circuit, and a first camera module and a second camera module juxtaposed with the first camera module; the first flexible printed circuit comprises a first body and a first connecting end extending from the first body, the first body being connected to the first camera module, and the first connecting end being configured to be connected to a main circuit board of the mobile terminal; the second flexible printed circuit comprises a second body, and an extension portion and a second connecting end sequentially extending from the second body, the second body being connected to the second camera module, the extension portion and the first body being arranged in a superposition manner, and the second connecting end being configured to be connected to the main circuit board of the mobile terminal; the first connecting end and the second connecting end are configured so that a smallest one of distances from the first connecting end to an antenna clearance zone of the main circuit board and distances from the second connecting end to the antenna clearance zone is greater than or equal to a predetermined value.

2. The dual-camera module assembly according to claim 1, characterized in that the extension portion and the second connecting end extend from the second body sequentially along a first direction, the first direction referring to a direction parallel to an arrangement direction of the first camera module and the second camera module; the first connecting end extends from the first body along a second direction, the second direction referring to a direction perpendicular to the arrangement direction of the first camera module and the second camera module.

3. The dual-camera module assembly according to claim 2, characterized in that the first connecting end is configured so that a minimum distance from the first connecting end to the antenna clearance zone of the main circuit board is equal to the predetermined value.

4. The dual-camera module assembly according to claim 1, characterized in that the first connecting end extends from the first body along a first direction, the first direction referring to a direction parallel to an arrangement direction of the first camera module and the second camera module; the second connecting end extends from the extension portion along a second direction, the second direction referring to a direction perpendicular to the arrangement direction of the first camera module and the second camera module.

5. The dual-camera module assembly according to claim 1, characterized in that the extension portion and the first connecting end are arranged in a paralleled and staggered manner, and the extension portion and the second connecting end extend from the second body sequentially along a first direction, the first direction referring to a direction parallel to an arrangement direction of the first camera module and the second camera module.

6. The dual-camera module assembly according to claim 1, characterized in that the extension portion and the first connecting end are arranged in a paralleled and staggered manner, and the second connecting end extends from the extension portion along a second direction, the second direction referring to a direction perpendicular to an arrangement direction of the first camera module and the second camera module.

7. The dual-camera module assembly according to claim 6, characterized in that the first connecting end is configured so that a minimum distance from the first connecting end to the antenna clearance zone of the main circuit board is equal to the predetermined value.

8. The dual-camera module assembly according to claim 1, characterized in that the dual-camera module assembly further comprises a reinforcement board, and the reinforcement board is provided to a side of the second body away from the second camera module.

9. The dual-camera module assembly according to claim 8, characterized in that the extension portion and the second connecting end extend from the second body sequentially along a first direction, the first direction referring to a direction parallel to an arrangement direction of the first camera module and the second camera module; the first connecting end extends from the first body along a second direction, the second direction referring to a direction perpendicular to the arrangement direction of the first camera module and the second camera module.

10. The dual-camera module assembly according to claim 8, characterized in that the first connecting end extends from the first body along a first direction, the first direction referring to a direction parallel to an arrangement direction of the first camera module and the second camera module; the second connecting end extends from the extension portion along a second direction, the second direction referring to a direction perpendicular to the arrangement direction of the first camera module and the second camera module.

11. The dual-camera module assembly according to claim 8, characterized in that the extension portion and the first connecting end are arranged in a paralleled and staggered manner, and the extension portion and the second connecting end extend from the second body sequentially along a first direction, the first direction referring to a direction parallel to an arrangement direction of the first camera module and the second camera module.

12. The dual-camera module assembly according to claim 8, characterized in that the extension portion and the first connecting end are arranged in a paralleled and staggered manner, and the second connecting end extends from the extension portion along a second direction, the second direction referring to a direction perpendicular to an arrangement direction of the first camera module and the second camera module.

13. The dual-camera module assembly according to claim 1, characterized in that the first connecting end is provided with a first connector, the second connecting end is provided with a second connector, the first connector is configured to be connected to a first slot in the main circuit board of the mobile terminal, and the second connector is configured to be connected to a second slot in the main circuit board of the mobile terminal.

14. The dual-camera module assembly according to claim 1, characterized in that the dual-camera module assembly further comprises a mounting rack, the first camera module and the second camera module are mounted to the mounting rack, and the mounting rack is configured to be fixedly connected to the main circuit board of the mobile terminal.

15. The dual-camera module assembly according to claim 1, characterized in that the extension portion is superposed on the first body.

16. A dual-camera module assembly, applied in a terminal and characterized in that the dual-camera module assembly comprises a first flexible printed circuit, a second flexible printed circuit, a first camera module and a second camera module juxtaposed with the first camera module; the first flexible printed circuit comprises a first body and a first connecting end extending from the first body, and the first body being connected to the first camera module; the second flexible printed circuit comprises a second body, and an extension portion and a second connecting end sequentially extending from the second body, the second body being connected to the second camera module, and the extension portion being superposed on the first body; the first connecting end and the second connecting end are configured so that a smallest one of distances from the first connecting end to an antenna clearance zone of a main circuit board of the terminal and distances from the second connecting end to the antenna clearance zone is greater than or equal to a predetermined value.

17. The dual-camera module assembly according to claim 16, characterized in that the terminal is a mobile terminal.

18. A mobile terminal, comprising a dual-camera module assembly and a main circuit board, the main circuit board being provided with an antenna clearance zone, the dual-camera module assembly comprising a first flexible printed circuit, a second flexible printed circuit, a first camera module and a second camera module juxtaposed with the first camera module; the first flexible printed circuit comprising a first body and a first connecting end extending from the first body, the first body being connected to the first camera module, and the first connecting end being connected to the main circuit board of the mobile terminal; the second flexible printed circuit comprising a second body, and an extension portion and a second connecting end sequentially extending from the second body, the second body being connected to the second camera module, the extension portion and the first body being arranged in a superposition manner, and the second connecting end being connected to the main circuit board of the mobile terminal; a smallest one of distances from the first connecting end to the antenna clearance zone of the main circuit board and distances from the second connecting end to the antenna clearance zone being greater than or equal to a predetermined value.

19. The mobile terminal according to claim 18, characterized in that the dual-camera module assembly is electrically connected with the main circuit board.

20. The mobile terminal according to claim 18, characterized in that the main circuit board can be a printed circuit board.

* * * * *